United States Patent
Gauthier, Jr. et al.

(10) Patent No.: US 7,943,438 B2
(45) Date of Patent: May 17, 2011

(54) STRUCTURE AND METHOD FOR A SILICON CONTROLLED RECTIFIER (SCR) STRUCTURE FOR SOI TECHNOLOGY

(75) Inventors: Robert J. Gauthier, Jr., Hinesburg, VT (US); Junjun Li, Williston, VT (US); Souvick Mitra, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 217 days.

(21) Appl. No.: 12/031,084

(22) Filed: Feb. 14, 2008

(65) Prior Publication Data

US 2009/0206367 A1  Aug. 20, 2009

(51) Int. Cl.
*H01L 21/332* (2006.01)
(52) U.S. Cl. .. 438/133; 438/135; 438/136; 257/E21.358
(58) Field of Classification Search .................. 438/133, 438/135, 136; 257/E21.358
See application file for complete search history.

(56) References Cited

U.S. PATENT DOCUMENTS

| | | | |
|---|---|---|---|
| 5,708,288 A * | 1/1998 | Quigley et al. | 257/355 |
| 6,015,992 A | 1/2000 | Chatterjee et al. | |
| 6,521,952 B1 | 2/2003 | Ker et al. | |
| 6,750,515 B2 | 6/2004 | Ker et al. | |
| 6,768,619 B2 | 7/2004 | Ker et al. | |
| 6,791,122 B2 | 9/2004 | Avery et al. | |
| 6,909,149 B2 | 6/2005 | Russ et al. | |
| 6,987,303 B2 | 1/2006 | Yu | |
| 2002/0154463 A1 | 10/2002 | Mergens et al. | |
| 2004/0016992 A1* | 1/2004 | Mallikarjunaswamy | 257/546 |
| 2005/0212051 A1 | 9/2005 | Jozwiak et al. | |
| 2008/0001168 A1* | 1/2008 | Manna et al. | 257/173 |

* cited by examiner

*Primary Examiner* — George Fourson
*Assistant Examiner* — John M Parker
(74) *Attorney, Agent, or Firm* — Anthony Canale; Roberts Mlotkowski Safran & Cole, P.C.

(57) ABSTRACT

A design structure is embodied in a machine readable medium for designing, manufacturing, or testing a design. The design structure includes a P+-N body diode and an N+-P body diode. The P+-N body diode and the N+-P body diode are laterally integrated.

9 Claims, 16 Drawing Sheets

Section A-A

Section B-B

STRUCTURE AND METHOD FOR A SILICON CONTROLLED RECTIFIER (SCR) STRUCTURE FOR SOI TECHNOLOGY

FIELD OF THE INVENTION

The present invention generally relates to a design structure and method of manufacturing a circuit, and more specifically to a design structure and method for a silicon controlled rectifier (SCR) structure for SOI technology.

BACKGROUND OF THE INVENTION

An ESD event refers to a phenomenon of electrical discharge of a current (positive or negative) for a short duration during which a large amount of current is provided to an integrated circuit (IC). The large current may be built-up from a variety of sources, such as the human body. An ESD event commonly results from the discharge of a high voltage potential (typically, several kilovolts) and leads to pulses of high current (several amperes) of a short duration (typically, 100 nanoseconds). An ESD event is generated within an IC, illustratively, by human contact with the leads of the IC or by electrically charged machinery being discharged in other leads of an IC. During installation of integrated circuits into products, these electrostatic discharges may destroy the IC and thus require expensive repairs on the products, which could have been avoided by providing a mechanism for dissipation of the electrostatic discharge to which the IC may have been subjected.

Manufacturers and users of ICs must take precautions to avoid ESD. For example, ESD prevention can be part of the device itself and may include special design techniques for device input and output pins. Additionally, external protection components can also be used with circuit layout. For example, to protect ICs from an ESD event, many schemes have been implemented, including use of a silicon controlled rectifier (SCR). An SCR can sustain high currents, hold the voltage across the SCR at a low level and may be implemented to bypass high current discharges associated with an ESD event.

Recent advances in integrated circuits have included further development of silicon-on-insulator (SOI) technology. SOI-based devices differ from conventional silicon-built devices in that the silicon junction is above an electrical insulator, typically silicon dioxide or (less commonly) sapphire. SOI technology utilizes an insulating substrate in place of a conventional silicon substrate to improve process characteristics, such as speed and latch-up susceptibility. The choice of insulator depends largely on intended application, with sapphire being used for radiation-sensitive applications and silicon oxide preferred for improved performance and diminished short channel effects in microelectronics devices.

Devices in advanced microelectronics employ silicon-on-insulator (SOI) technology for improved performance, where the active area of a device is in a thin silicon layer, isolated from the bulk silicon substrate by a buried oxide (BOX) layer. The BOX layer provides electrical isolation from the substrate for improved field distribution in the active area. The implementation of SOI technology is one of several manufacturing strategies employed to allow the continued miniaturization of microelectronic devices.

However, SOI technology is still susceptible to an ESD event. Moreover, due to the thermal conductivity of the insulator, e.g., buried oxide, and the floating body effect from active devices being formed over the insulator instead of a semiconductor substrate, the ESD problem has been especially pronounced in silicon-on-insulator (SOI) complementary metal oxide semiconductor (CMOS) field effect technologies, which require new considerations and approaches for ESD protection.

An SCR is used for advanced SOI technologies to provide thin oxide, e.g., $SiO_2$, I/O ESD protection. Additionally, utilizing an SCR, high ESD performance and low capacitance loading may be achieved. Moreover, application specific integrated circuits (ASICs) such as high-speed series link (HSS) applications using advanced SOI technologies has necessitated that SCRs be enabled for SOI. However, an SCR in bulk technologies cannot be directly mapped to SOI technologies.

Accordingly, there exists a need in the art to overcome the deficiencies and limitations described hereinabove.

SUMMARY OF THE INVENTION

In a first aspect of the invention, an SOI SCR structure comprises a P+-N body diode and an N+-P body diode. Additionally, the P+-N body diode and the N+-P body diode are laterally integrated.

In an additional aspect of the invention, a method comprises forming a P+-N body diode in a lightly doped N-well and forming an N+-P body diode in a lightly doped P-well. The P+-N body diode and the N+-P body diode are laterally integrated and form a silicon controlled rectifier (SCR).

In a further aspect of the invention, a design structure is embodied in a machine readable medium for designing, manufacturing, or testing a design. The design structure comprises a P+-N body diode and an N+-P body diode. Additionally, the P+-N body diode and the N+-P body diode are laterally integrated.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The present invention generally relates to a design structure, and more specifically to a design structure and method for a silicon controlled rectifier (SCR) structure for SOI technology. In one embodiment, the present invention includes an electrostatic discharge (ESD) protection circuit in a semiconductor integrated circuit (IC) having protected circuitry, where the ESD protection circuit comprises a silicon controlled rectifier (SCR) for shunting ESD current away from the protected circuitry. The SCR comprises a substrate, an N-body region, and an adjacent P-body region formed over the substrate, where the N-well and P-well define a PN junction therebetween. An insulator layer, e.g., a BOX layer, is formed over the substrate and electrically isolates the N-well and P-well from the substrate.

By implementing the invention, an SCR may be implemented in SOI technology. Moreover, the SCR structure for SOI technology provides very low capacitance loading. Further, the SCR structure for SOI technology provides robust ESD performance, e.g., low holding voltage and scalable on-resistance.

Figure 1A:
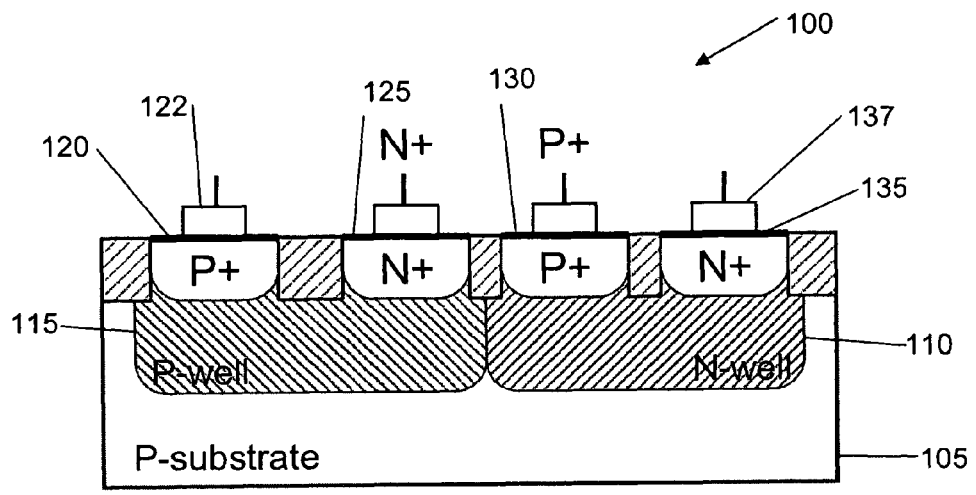
FIGS. 1A-1B show an SCR formed in a bulk substrate.

FIG. 1A illustrates a cross sectional view of an ESD protection device formed on bulk substrate technology. As shown in FIG. 1A, an SCR 100 is formed in a lightly-doped, e.g., P-type substrate 105. The SCR 100 includes a P-well 115 and an N-well 110 which are formed in the substrate 105. Moreover, an N+ region 125 and P+ region 120 are formed in the P-well 115 and an N+ region 135 and P+ region 130 are formed in the N-well 110. The P+ region 130 forms the anode of the SCR 100 and the N+ region forms the cathode of the SCR 100. As should be understood by one skilled in the art, the P+ region 130, the N-well 110 and the P-well 115 form the PNP transistor and the N+ region 125, the P-well 115 and the N-well 110 form the NPN transistor. Thus, together the NPN transistor and the PNP transistor form the PNPN structure of the SCR 100. Additionally, the SCR 100 includes a contact 137 for the N+ region 135 and a contact 122 for the P+ region 120 for triggering the SCR 100.

Figure 1B:
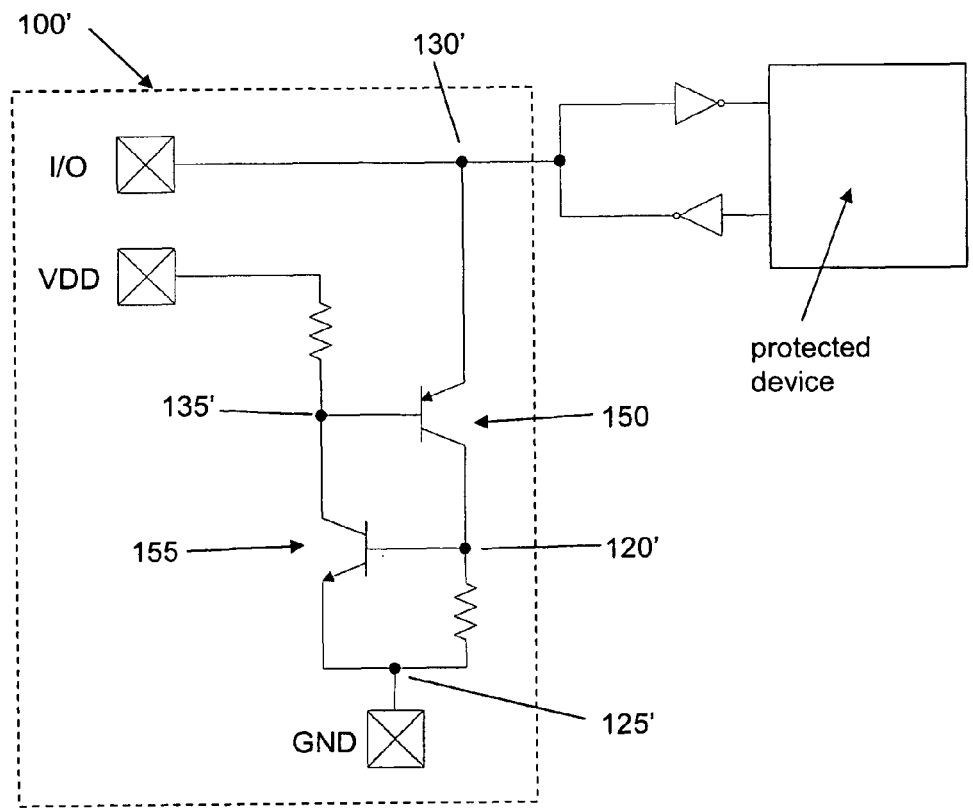

FIG. 1B illustrates a schematic circuit with an SCR 100'. As shown in FIG. 1 B, the SCR 100' is connected between a voltage source and a protected device. More specifically, the anode 130' of the SCR 100' is connected between an I/O and the protected device.

As shown in FIG. 1B, the SCR device 100' includes a PNP transistor 150 and an NPN transistor 155. The PNP transistor 150 has an emitter connected to the pad on the anode 130, which is represented by node 130', the base connected to node 135' and the collector connected to node 120'. The NPN transistor 155 has its collector connected to node 135', the base connected to node 120' and the emitter connected to the cathode 125, represented by node 125'. Additionally, the cathode is connected to ground and the anode is connected to an input signal line. The SCR 100' is also connected to the protected device.

With the occurrence of an ESD event, the SCR 100' directs the discharge current during an ESD through the SCR 100' and away from the protected device. More specifically, in operation, in the normal "off" state the SCR 100' restricts current flow to the leakage current. When the anode to N-body or the P-body to cathode voltage exceeds a certain threshold, the SCR 100' turns "on" and conducts current to ground. The SCR 100' will remain in the "on" state even after the trigger current is removed so long as current through the SCR device remains above the holding current. Once current falls below the holding current for an appropriate period of time, the SCR 100' will switch off allowing current to pass to the protected device. Thus, in this way, the SCR 100' redirects current, e.g., from an ESD event, away from the devices being protected and shunts the current to ground, such that the protected device is not damaged by the ESD event.

Figure 2A:
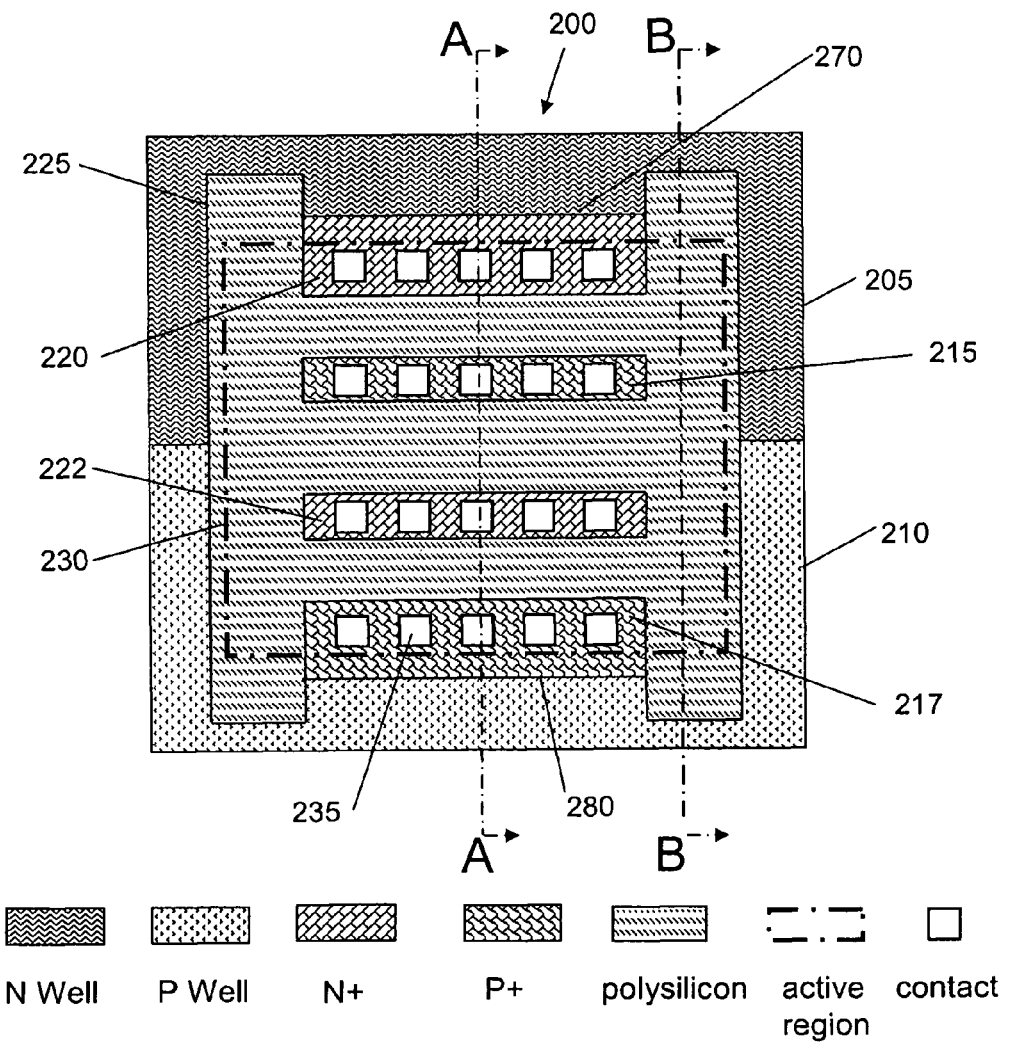
FIGS. 2A-2C show an exemplary embodiment of an SOI SCR according to an aspect of the invention.
Figure 2B:
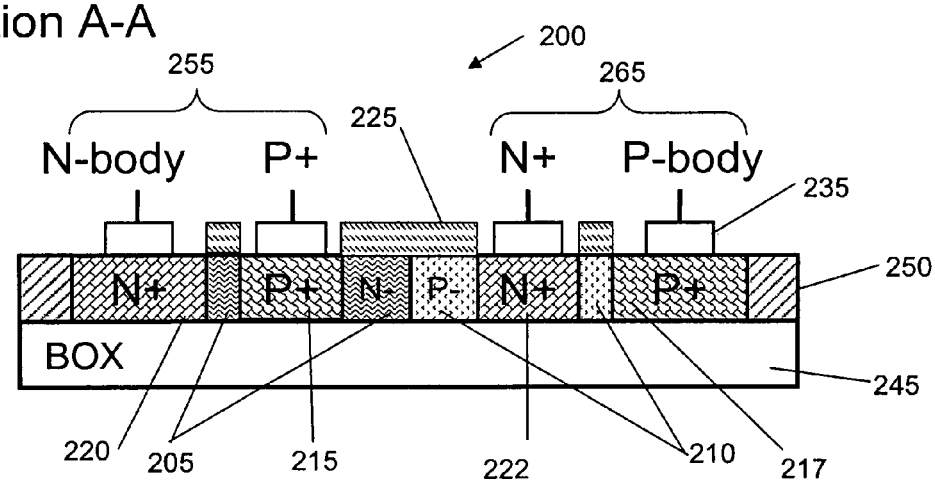
Figure 2B:
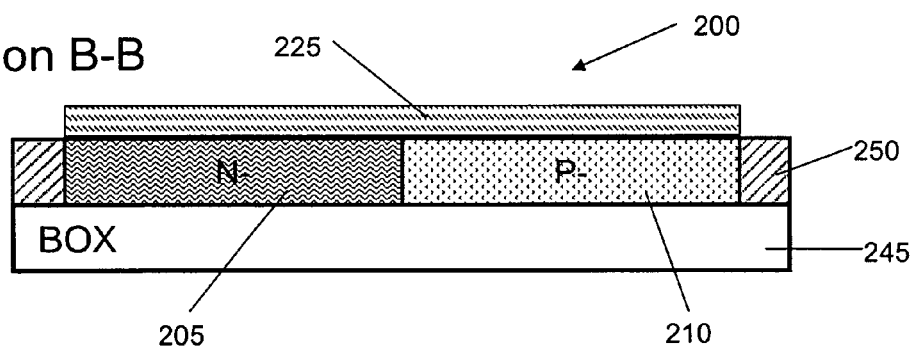

FIG. 2A shows the photo mask layer shapes that are used to fabricate the SCR, and FIG. 2B illustrates a sectional view of an exemplary SCR 200 formed on an SOI substrate 245 (shown in FIG. 2B), e.g., a buried oxide (BOX) layer, according to an aspect of the invention. Additionally, while not shown, it should be understood that the BOX layer 245 is formed on a substrate, e.g., a P-type silicon substrate. The SCR 200 is generally fabricated by forming the buried insulative layer, e.g., BOX layer 245, over the substrate (not shown). In embodiments, a thin layer of undoped silicon, e.g., monocrystaline, uniform silicon, is formed over the BOX layer 245. In an exemplary embodiment, the BOX layer 245 is formed by implanting and annealing oxygen atoms in the substrate. The thickness of the BOX layer 245 is typically in the range of 100 to 1000 nm.

Shallow trench isolation (STI) 250 (shown in FIG. 2B) is provided by locally etching trenches into the silicon film layer until the BOX layer 245 is reached. In particular, trenches are etched in specific areas, an insulator material, e.g., silicon dioxide ($SiO_2$), is illustratively deposited, and the surface is then planarized. The portion of the silicon layer not filled by the STI insulator material is utilized to deploy an active region in which the active transistors and devices are formed. Typically, the STI 250 is used to separate regions that will receive high doping. The high doped regions may also be separated by other techniques known in the art, which are beneficial to the SCR operation.

As shown in FIGS. 2A and 2B, the SCR 200 includes an N-well 205 and a P-well 210 implanted within the silicon that is sitting on top of the BOX layer 245. Moreover, the N-well 205 and P-well 210 are formed adjacent to each other and define a PN junction at the adjoining boundary. A layer of polysilicon 225 is deposited over portions of the SCR 200. A highly-doped N+ region 220 and a highly-doped P+ region 215 are formed within the N-well 205 and in contact with the BOX layer 245. Additionally, a highly-doped N+ region 222 and a highly-doped P+ region 217 are formed within the P-well 210 and in contact with the BOX layer 245. A plurality of contacts 235 are formed on each of the highly-doped N+ regions 220 and 222 and the highly-doped P+ regions 215 and 217. As shown in FIG. 2B, an active region of the SCR 200 is identified by dashed line 240. The anode of the SCR 200 is formed by the highly doped P+ region 215 and the cathode of the SCR 200 is formed by the highly doped N+ region 222.

The PNP transistor of the SCR 200 is formed from the highly-doped P+ region 215, the N-well 205 and the P-well 210. In this configuration, the highly-doped P+ region 215 is the emitter, the N-well 205 is the base and the P-well 210 is the collector. Additionally, the NPN transistor is formed from the highly-doped N+ region 222, the P-well 210 and the N-well 205. In this configuration, the highly-doped N+ region 222 is the emitter, the P-well 210 is the base and the N-well 205 is the collector. It should be noted that the N-well 205 serves dual functions as the collector of the NPN transistor and the base of the PNP transistor. Likewise, the P-well 210 serves dual functions as the collector of the PNP transistor and the base of the NPN transistor.

The P-body is in contact with the P+ region 235, disposed in the P-well 210 and is spaced proximate to the N+ cathode region 222, and the P-body to N+ cathode junction helps trigger the SCR 200 when forward biased. Further, the N-body is in contact with the N+ region 220, disposed in the N-well 205 and is spaced proximate to the P+ anode region 215, and the P+ anode to N-body junction helps trigger the SCR 200 when forward biased.

Additionally, as shown in FIG. 2B (Section A-A), the SCR device 200 comprises a lateral integrated P+/N-body diode 255 and N+/P-body diode 265 according to an aspect of the invention. That is, the P+/N-body diode 255 and N+/P-body diode 265 are formed side-by-side in the same planar layer, the width of both diodes are substantially the same as the width of the SCR.

Figure 2C:
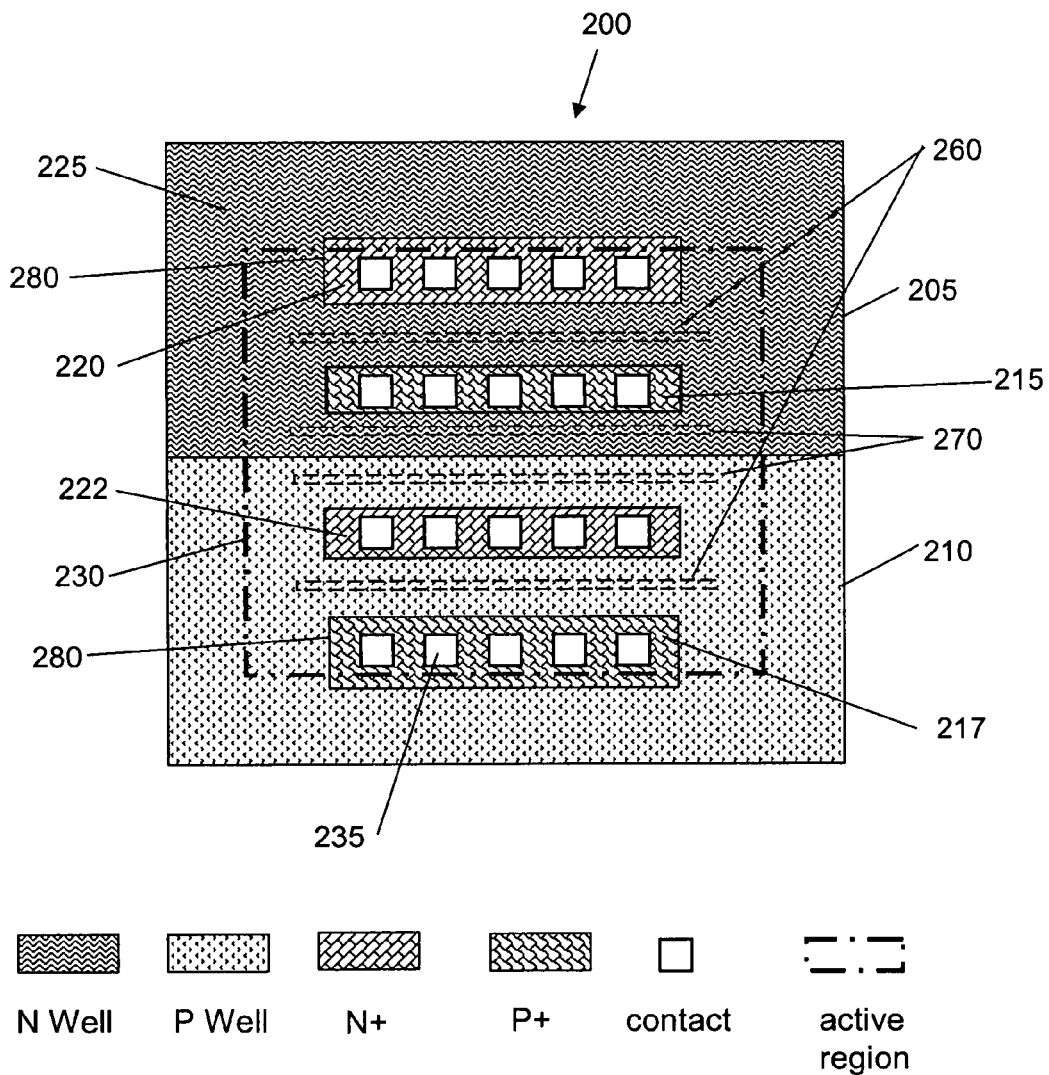

FIG. 2C shows the SCR 200 of FIGS. 2A and 2B, without the polysilicon layer 225 shown to facilitate an understanding of the present invention. As shown in FIG. 2C, according to an aspect of the invention, the SCR n-/p- body designated by dashed lines 270 is connected to the n-/p- body of the integrated diode designated by dashed lines 260 through under the polysilicon channel 225 (not shown). That is, those portions of the P-well 210 and N-well 205 that form the n-/p- body 270 of the SCR are connected to those portions of the P-well 210 and N-well 205 that form the n-/p- body 260 of the integrated diode. Moreover, the connection of the SCR n-/p- body 270 and the integrated diode n-/p- body 260 is formed within the P-well 210 and N-well 205 under the polysilicon channel 225 (not shown).

Additionally, as shown in FIG. 2C, the SCR structure comprises a plurality of trigger diodes 280 disposed along the width of the SCR such that the width of each trigger diode 280 is approximately the same as the width of the SCR. A first conductivity region (e.g., the N-well 205) is in the active layer, which surrounds an electrode of one of the diodes (e.g., the P+ anode 215 of the diode/SCR) which provides at least two current paths in the SCR structure. More specifically, one current path is to the other electrode of the diode (e.g., the N+ regions 220 and N-body) and the other current path is to the SCR cathode 222. According to an aspect of the invention, by providing a plurality of trigger diodes 280 disposed along the width of the SCR where the width of each trigger diode 280 is substantially the same as the width of the SCR structure, the effective perimeter of the trigger diode provides more robust SCR triggering.

Figure 3:
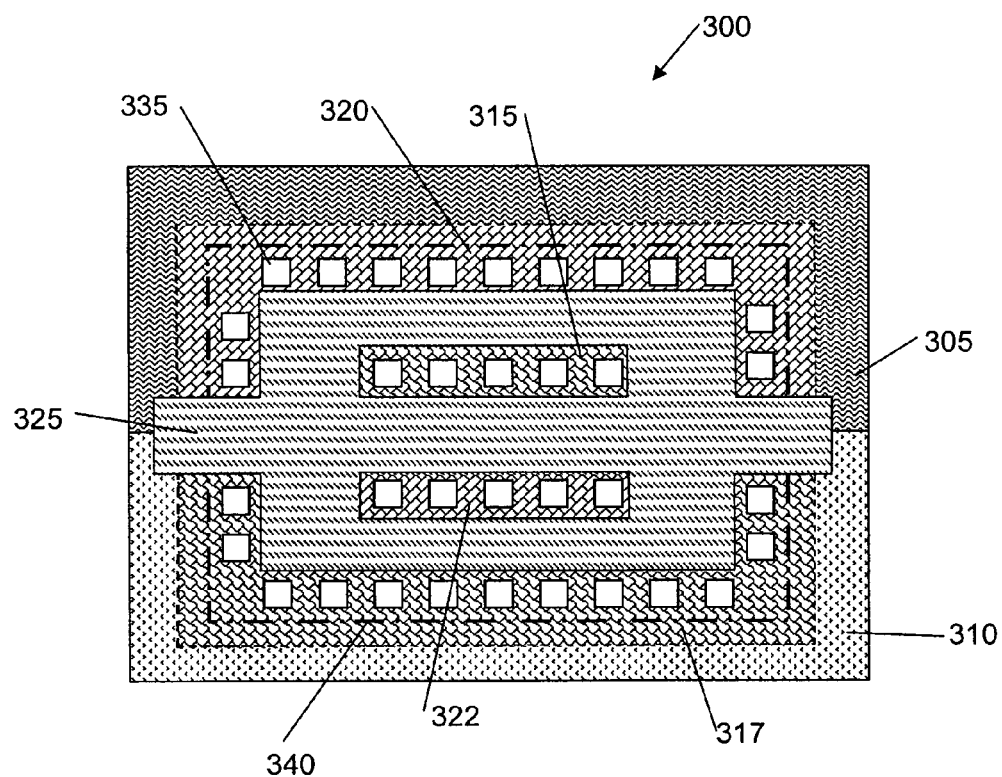
FIG. 3 shows an additional exemplary embodiment of an SOI SCR according to an aspect of the invention.
Figure 3:
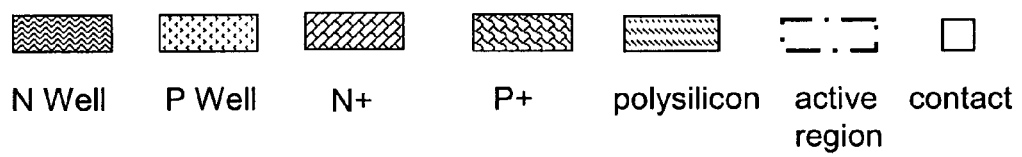

FIG. 3 shows a top view of a further exemplary embodiment of an SCR 300 according to an aspect of the invention. As shown in FIG. 3, the SCR 300 includes an N-well 305 and a P-well 310. As shown in FIG. 3, a layer of polysilicon 325 is deposited over portions of the SCR 300. A highly-doped N+ region 320 and a highly-doped P+ region 315 are formed within the N-well 305. Additionally, a highly-doped N+ region 322 and a highly-doped P+ region 317 are formed within the P-well 310. A plurality of contacts 335 are formed on each of the highly-doped N+ regions 320 and 322 and the highly-doped P+ regions 315 and 317. An active region of the SCR 300 is identified by dashed line 340. By including additional contacts 335 in the SCR 300 (as compared to SCR 200) a more efficient carrier injection to the P-well 310 and the N-well 305 is achievable.

Figure 4A:
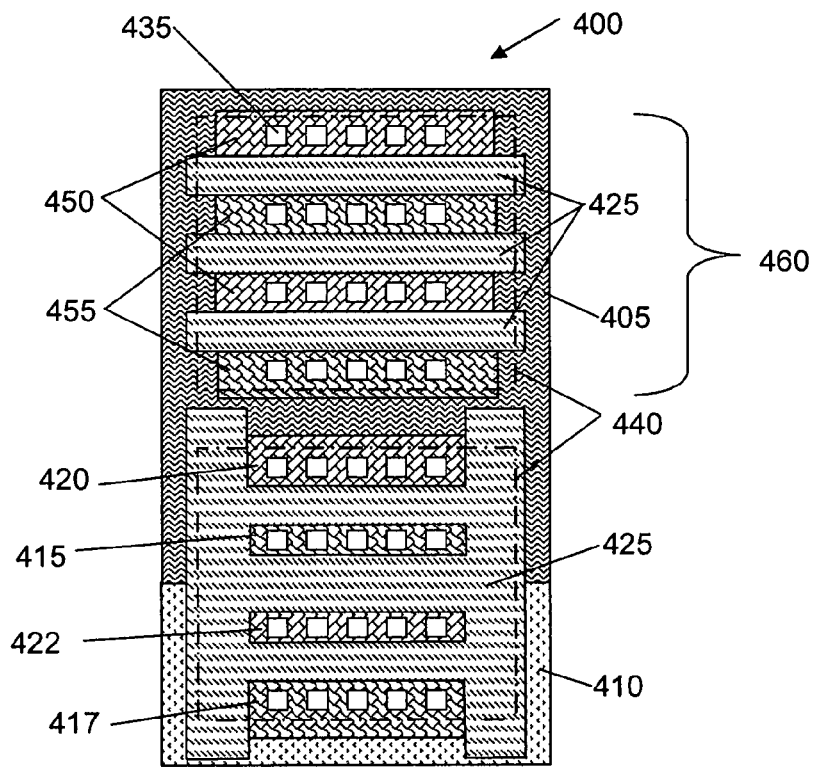
FIGS. 4a-4b shows an exemplary embodiment of a diode-triggered SOI SCR according to an aspect of the invention.

FIG. 4A shows an exemplary embodiment of a diode-triggered SCR 400 according to a further aspect of the invention. As shown in FIG. 4A, the SCR 400 includes an N-well 405 and a P-well 410. A highly-doped N+ region 420 and a highly-doped P+ region 415 are formed within the N-well 405. Additionally, a highly-doped N+ region 422 and a highly-doped P+ region 417 are formed within the P-well 410. A plurality of contacts 435 are formed on each of the highly-doped N+ regions 420 and 422 and the highly-doped P+ regions 415 and 417. An active region of the SCR 400 is identified by dashed line 440. As shown in FIG. 4A, a layer of polysilicon 425 is deposited over portions of the SCR 400.

Additionally, as shown in FIG. 4A, additional trigger diodes 460 may be integrated to form a diode-triggered SCR 400. In embodiments, SCR 400 includes an extended N-well 405. Within the extended N-well 405, additional P+ regions 455 and additional N+ regions 450 are formed including contacts 435, which form the trigger diodes 460. The additional trigger diodes 460 may be implemented to further tailor the trigger voltage of the SCR 400.

Figure 4B:
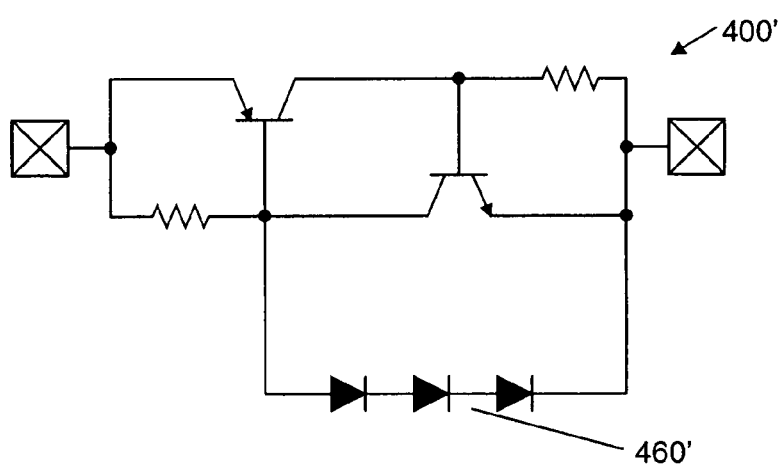

FIG. 4B shows a schematic circuit diagram of a diode-triggered SCR 400' of FIG. 4A. As shown in FIG. 4B, the diode-triggered SCR 400' includes a plurality of trigger diodes 460', which connect the N-well of the SCR to ground. As discussed above, the additional trigger diodes 460' may be implemented to tune the trigger voltage of the SCR 400'.

Figure 5:
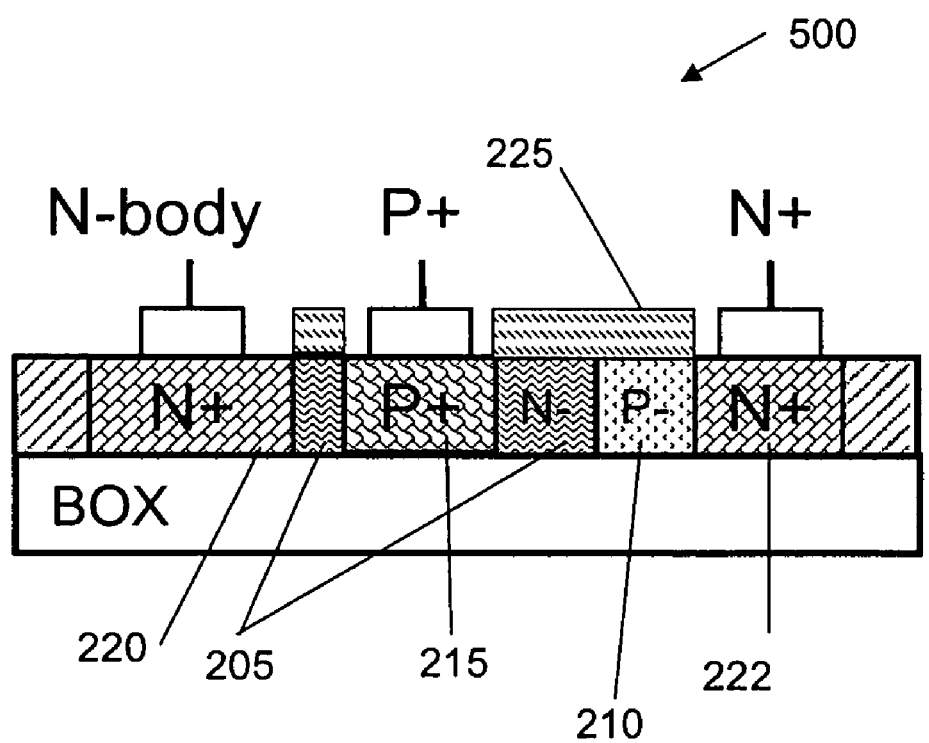
FIG. 5 shows an exemplary embodiment of a floating P-body SOI SCR according to an aspect of the invention.

FIG. 5 shows an exemplary embodiment of a floating P-body SOI SCR 500 according to a further aspect of the invention. As shown in FIG. 5, the floating P-body SOI SCR 500 may include the features of SCR 200, shown in FIG. 2A, without a P-body contact in the P-well 210. Accordingly, in this aspect of the invention the P-well 210 remains electrically floating. According to an aspect of the invention, by implementing the floating P-body SOI SCR 500, a lower trigger voltage may be achieved.

Figure 6:
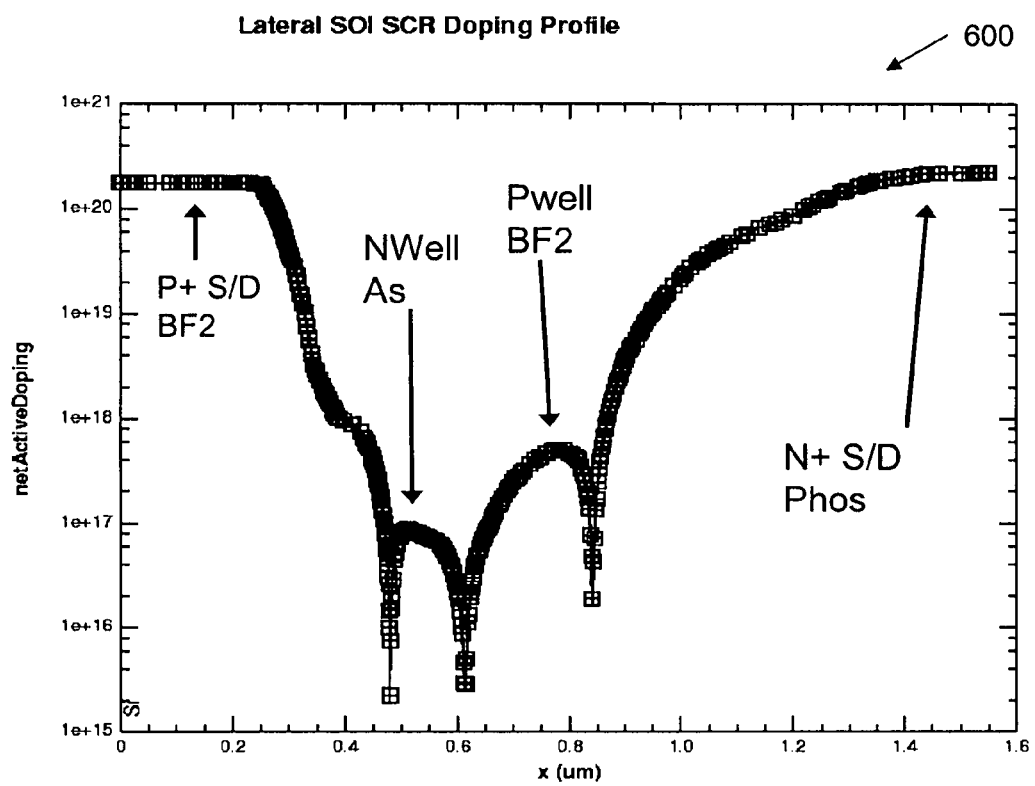
FIG. 6 shows an exemplary doping profile of an SOI SCR according to an aspect of the invention.

FIG. 6 shows an exemplary lateral SOI SCR net impurity profile according to an aspect of the invention. As shown in FIG. 6, in embodiments, the P+ regions may be implanted with $BF_2$ and end up with a net active concentration of approximately $1e+20$ $cm^{-3}$ and the P-well may be implanted with $BF_2$ and end up with a net active concentration of approximately $1.6e+18$ $cm^{-3}$. Moreover, the N+ regions may be implanted with phosphorus and end up with a net active concentration of approximately $1.2e+20$ $cm^{-3}$ and the N-well may be implanted with arsenic and end up with a net active concentration of approximately $1.0e+17$ $cm^{-3}$. However, it should be understood that the doping profiles shown in FIG. 6 is exemplary and that the invention contemplates other dopants and doping profiles.

Figure 7:
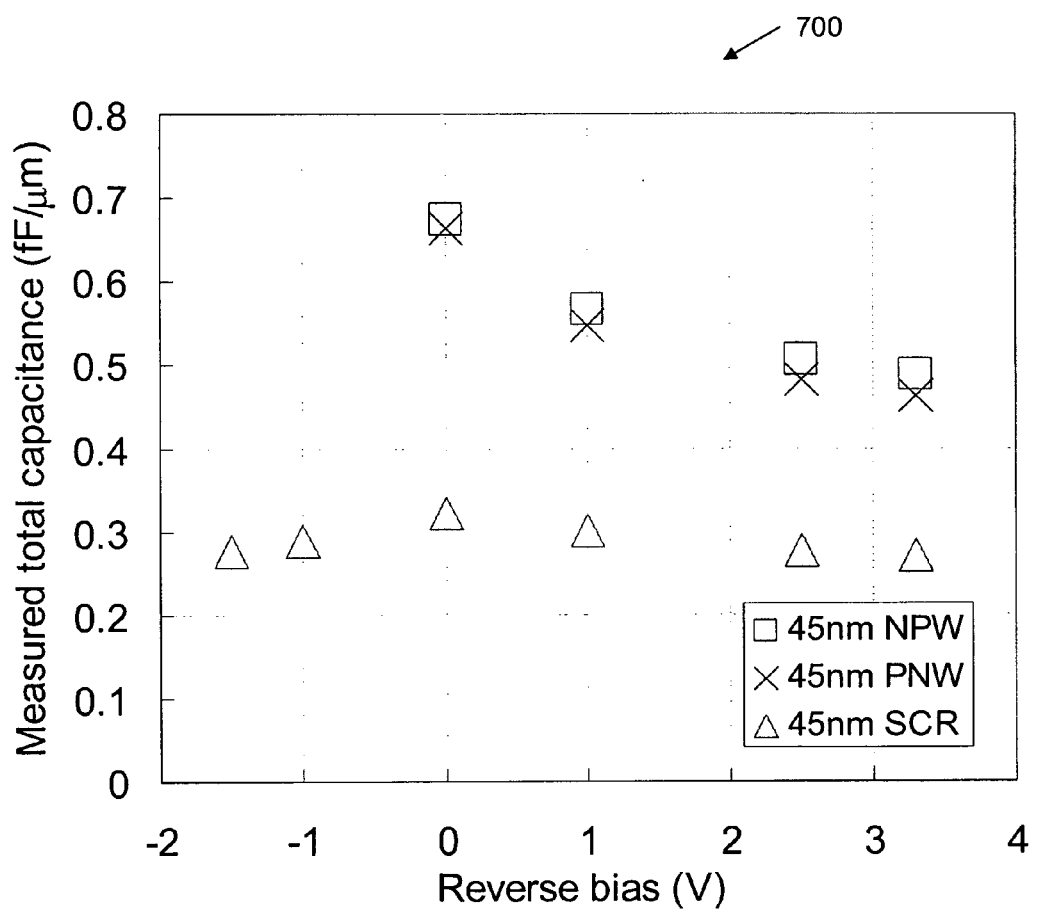
FIG. 7 shows a graph of reverse bias versus measured total capacitance according to an aspect of the invention.

FIG. 7 shows a plot 700 of SCR capacitance compared to capacitance of diodes. More specifically, FIG. 7 shows a plot 700 of reverse bias versus measured total capacitance for a P+ N-well diode, an N+ P-well diode and an SCR device. As shown in FIG. 7, the SCR device of the present invention exhibits a lower total capacitance over the range of reverse bias voltages, as compared to the P+ N-well diode and the N+ P-well diode. Thus, according to an aspect of the invention, the SCR provides a very low capacitance loading, which is a current need for high-speed series (HSS) link applications.

Figure 8:
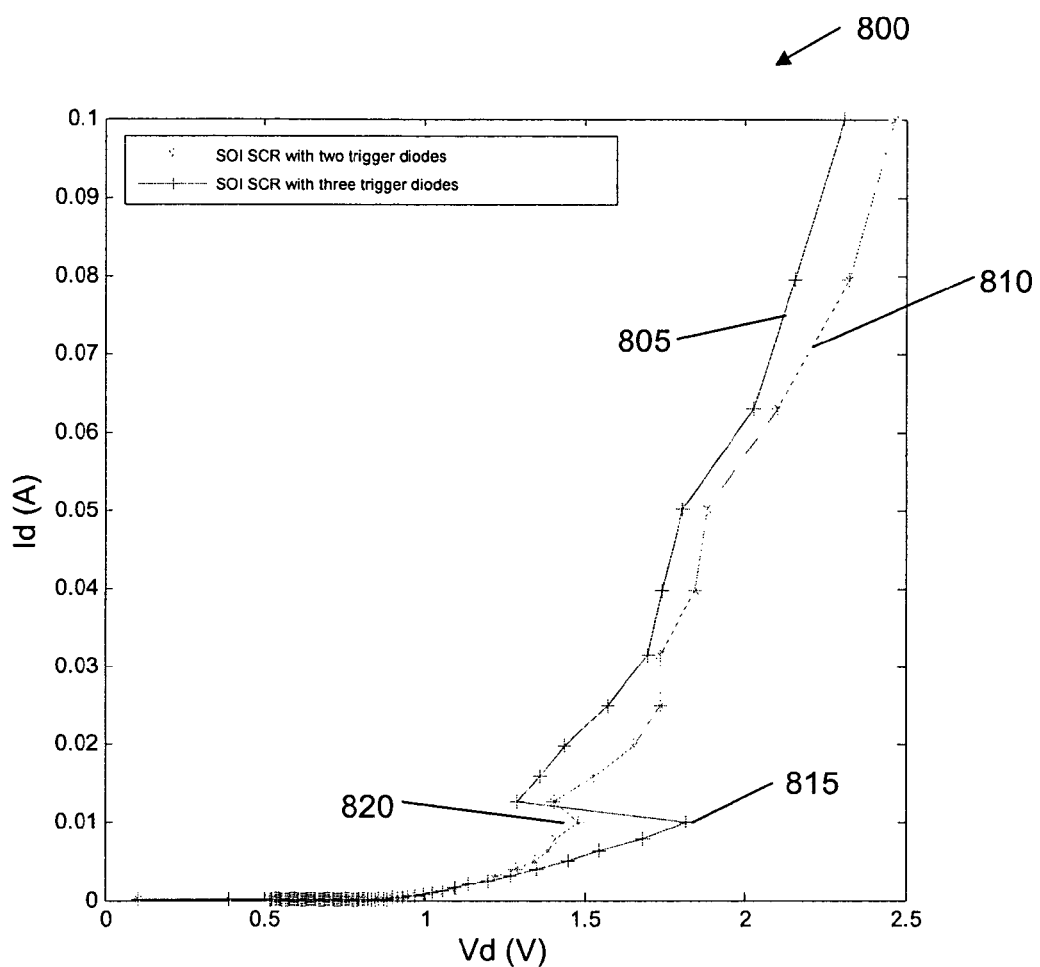
FIG. 8 shows a plot of current-voltage characteristics of an SOI SCR according to an aspect of the invention.

FIG. 8 shows a plot 800 of current-voltage characteristics of two exemplary SOI SCR devices. More specifically, FIG. 8 shows a plot of current-voltage characteristics of an SOI SCR having three trigger diodes 805 and an SOI SCR having two trigger diodes 810. As should be understood, the SCR is turned on after snapback. As shown in FIG. 8, the SOI SCR having three trigger diodes 805 has a trigger voltage of approximately 1.8 volts at snapback 815. Additionally, the SOI SCR having two trigger diodes 810 has a trigger voltage of approximately 1.5 volts at snapback 820. Thus, as shown in FIG. 8, the SOI SCR having three trigger diodes has a higher snapback point and a higher trigger voltage.

Device Formation Process

Figure 9:
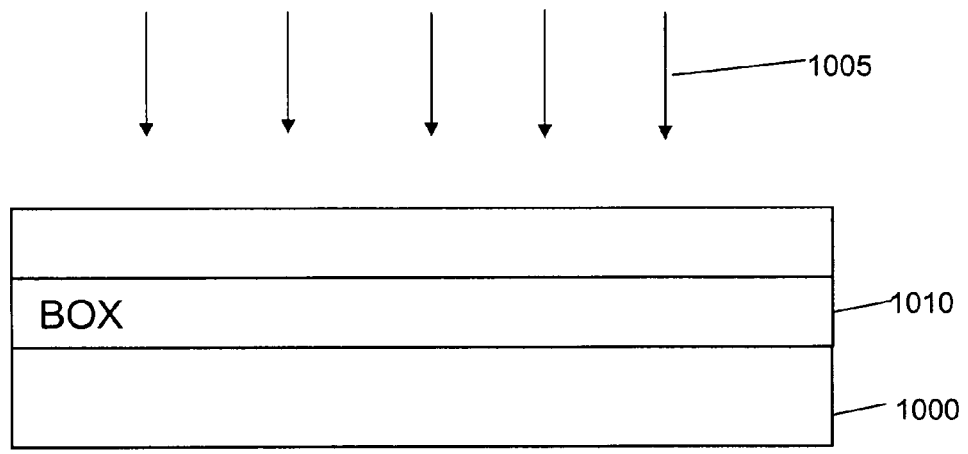
FIGS. 9-18 show process steps for forming a final structure shown in FIGS. 2A-2C in accordance with an aspect of the invention.

FIGS. 9-18 show process steps for forming a final structure shown in FIGS. 2A-2C in accordance with an aspect of the invention. FIG. 9 shows a sectional side view of a beginning structure in accordance with the invention. The beginning structure comprises a substrate 1000 in which oxygen 1005 is implanted and annealed to form BOX layer 1010. In embodiments, the substrate 1000 may be, for example, a P-type silicon substrate. Moreover, the substrate 1000 may be approximately 700-800 microns in thickness, with other thicknesses contemplated by the invention.

Figure 10:
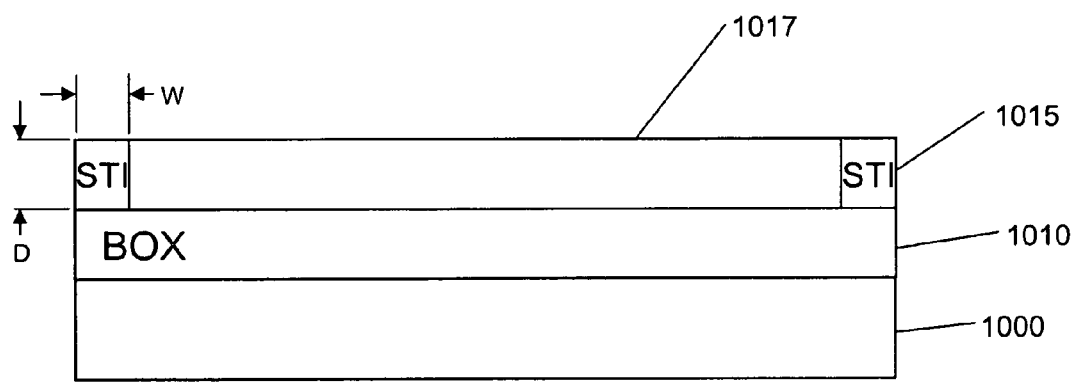

FIG. 10 shows the structure after further processing steps. As shown in FIG. 10, a shallow trench isolation (STI) 1015 is formed according to a conventional STI formation process, e.g., a lithography and etching process (e.g., a reactive ion etch (RIE)) followed by a deposition of a dielectric, e.g., $SiO_2$. As such, a description of the lithography, etch and deposition processes are not necessary for a person of ordinary skill in the art to practice this particular step.

Additionally, while the STI 1015 is shown in FIG. 10 as discrete elements, it should be understood that the STI 1015 may be formed in a ring structure or formation. Moreover, the silicon inside the STI 1015 defines an active area 1017 on the substrate 1000, on which the SCR may be formed. As shown in FIG. 10, the STI is in contact with the BOX layer 1010 to isolate the active area 1017. In embodiments, the STI 1015 may be about 50-100 nm in depth (D), with other depths contemplated by the invention. Additionally, in embodiments, the STI 1015 may be 0.15-1.0 μm in width (W), with other widths contemplated by the invention.

Figure 11:
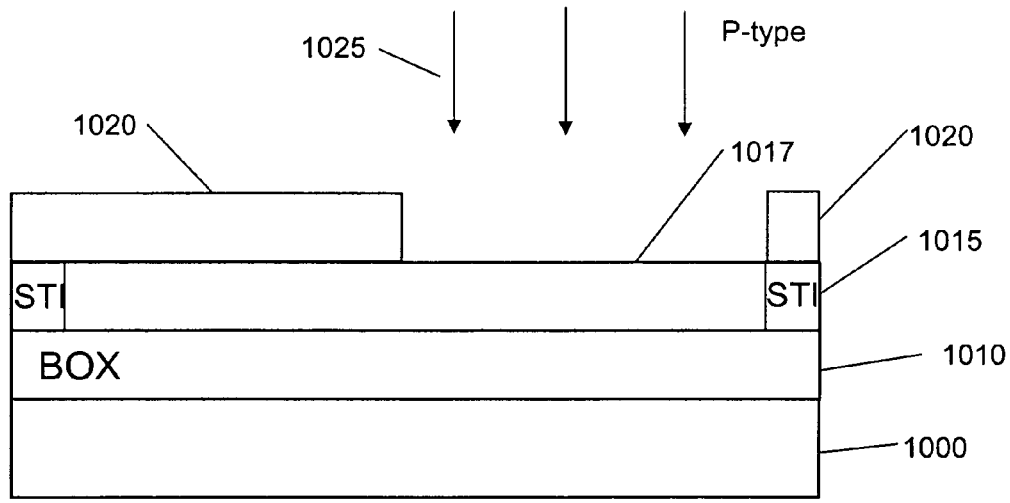

As shown in FIG. 11, a mask layer 1020 may be formed on the top of the substrate 1000 and over the STI 1015 and active area 1017. In embodiments, the mask layer 1020 may be formed, for example, by a conventional masking process. As such, a description of the masking process is not necessary for a person of ordinary skill in the art to practice this particular step. Additionally, as shown in FIG. 11, the mask layer 1020 has been etched to form an opening to expose a portion of the active area 1017. The mask layer 1020 may be etched using lithography and an RIE process, a description of which is not necessary for a person of ordinary skill in the art to practice this particular step.

Furthermore, the exposed region of the active area 1017 may be lightly implanted with a p-type dopant 1025, e.g., $BF_2$ to form the P-well 1030. Additionally, a second mask layer, e.g., a resist (not shown) may be formed over the active region 1017 and etched to expose the another portion of the active region. Subsequently, the other portion of the active region may be lightly implanted with an n-type dopant, e.g., As to form the N-well 1035.

Figure 12:
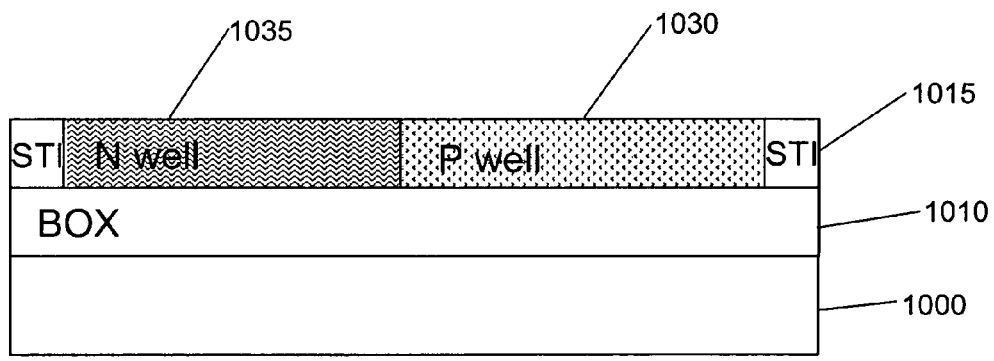

As shown in FIG. 12, the P-well 1030 and the N-well 1035 have been formed on the BOX layer 1010 by an implanting process. In embodiments, the width of the P-well 1030 and the width of the N-well 1035 may be between approximately 0.6 μm and 3.25 μm, although other dimensions are contemplated by the invention. Moreover, the P-well 1030 and the N-well 1035 are formed such that they each are in contact with the BOX layer 1010, e.g., to a depth of 50-1000 nanometers, depending upon the thickness of the active layer 1017 formed on the BOX layer 1010.

Figure 13:
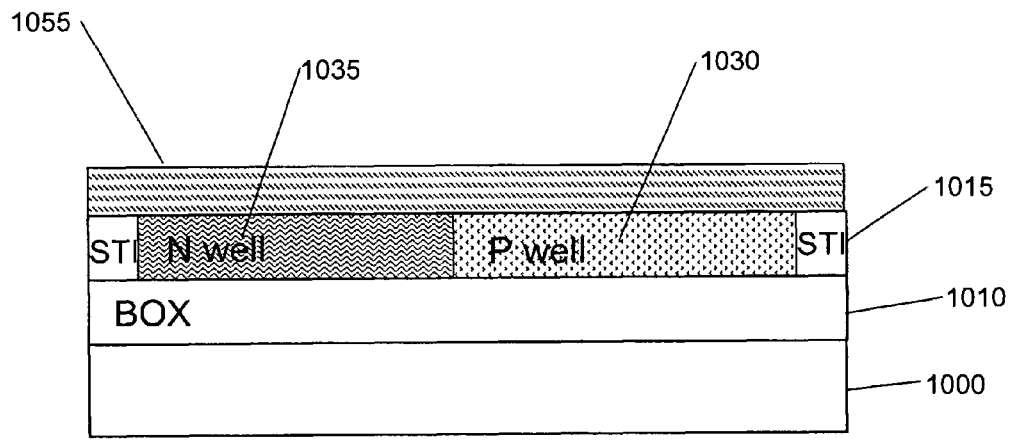

As shown in FIG. 13, a polysilicon layer 1055 may be deposited over the device. Alternatively, a silicide blocking layer may be used in place of the polysilicon layer 1055.

Figure 14:
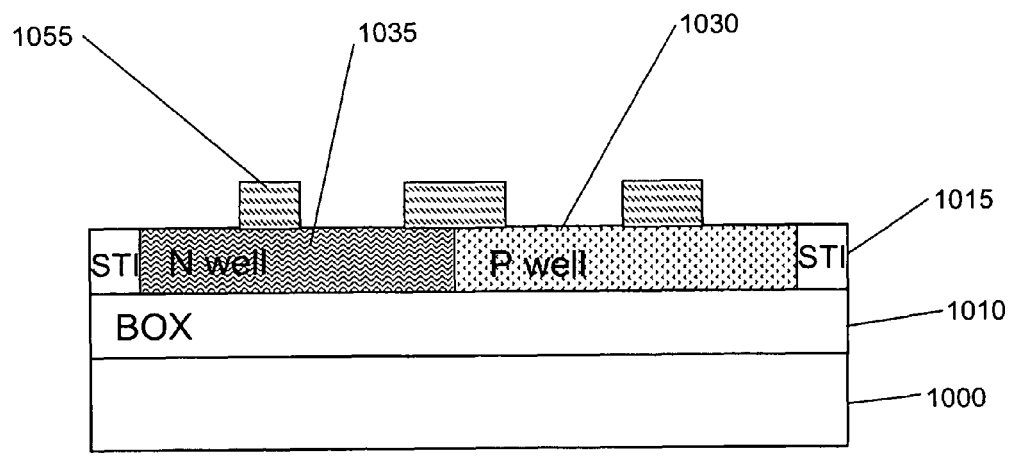

As shown in FIG. 14, the polysilicon layer 1055 has been etched to expose portions of the P-well 1030 and the N-well 1035. In embodiments, the etching may be performed using conventional lithography and RIE processes.

Figure 15:
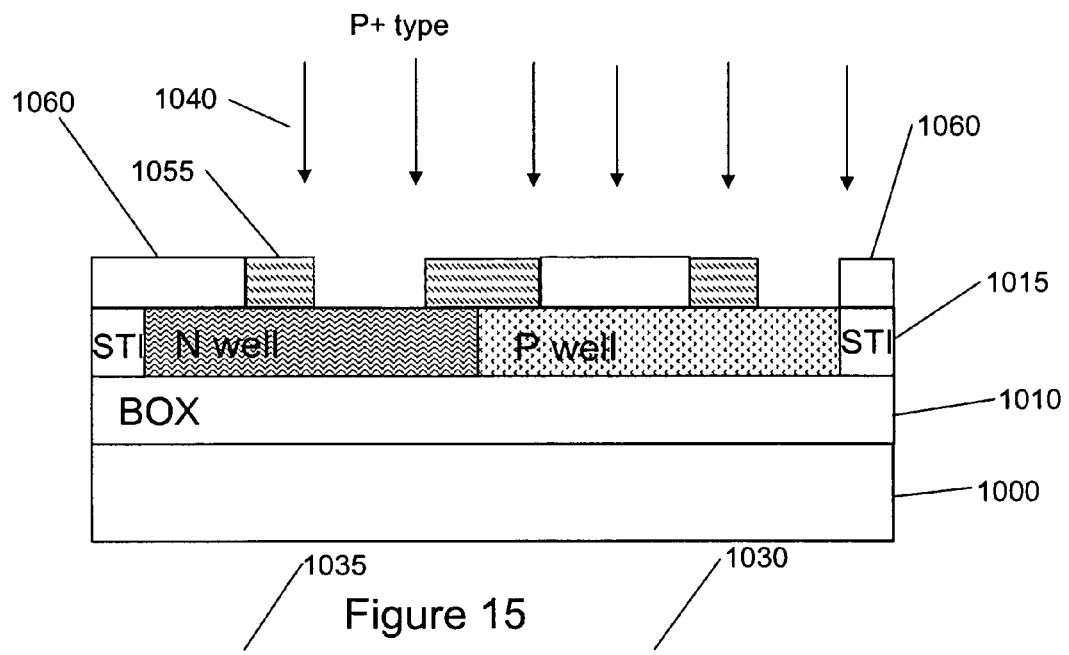

As shown in FIG. 15, a further masking layer 1060 has been formed on the device and etched to expose portions of the P-well 1030 and N-well 1035 in which P+ regions will be formed. The mask layer 1060 may be etched using conventional lithography and RIE processes. Additionally, as shown in FIG. 15, the exposed regions of the P-well 1030 and N-well 1035 may be implanted with a p-type dopant 1040, e.g., $BF_2$, to form the P+ regions 1060 (shown in FIG. 16). In embodiments, the width of the P+ regions 1060 may be between approximately 0.15 μm and 1 μm, although other dimensions are contemplated by the invention. As shown in FIG. 15, the P+ regions 1060 may be formed such that they are in contact with the BOX layer 1010.

Figure 16:
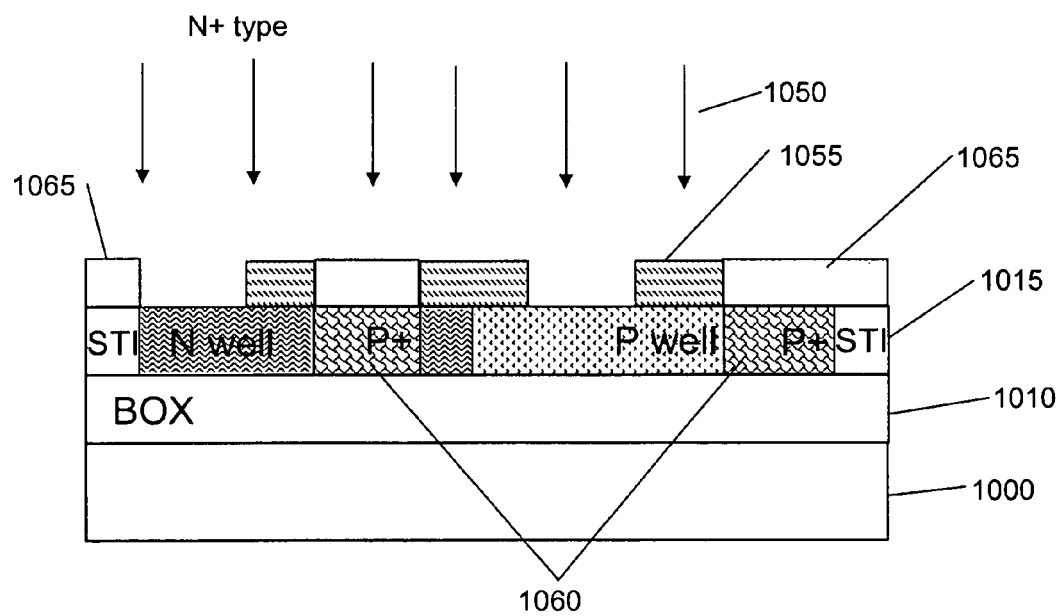

As shown in FIG. 16, the masking layer 1060 has been removed and an additional masking layer 1065 has been formed on the device and etched to expose portions of the P-well 1030 and N-well 1035 in which N+ regions will be formed. The mask layer 1065 may be etched using conventional lithography and RIE processes. Additionally, as shown in FIG. 16, the exposed regions of the P-well 1030 and N-well 1035 may be implanted with an n-type dopant 1050, e.g., As, to form the N+ regions 1065 (shown in FIG. 17). In embodiments, the width of the N+ regions 1065 may be between approximately 0.15 μm and 1 μm, although other dimensions are contemplated by the invention.

Figure 17:
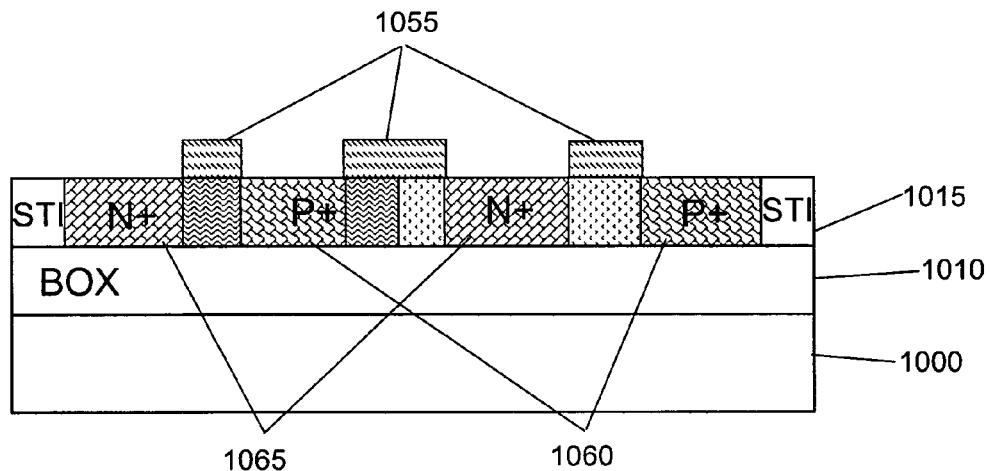

As shown in FIG. 17, the mask layer 1065 is removed. Also, the N+ regions 1065 may be formed such that they are in contact with the BOX layer 1010.

Figure 18:
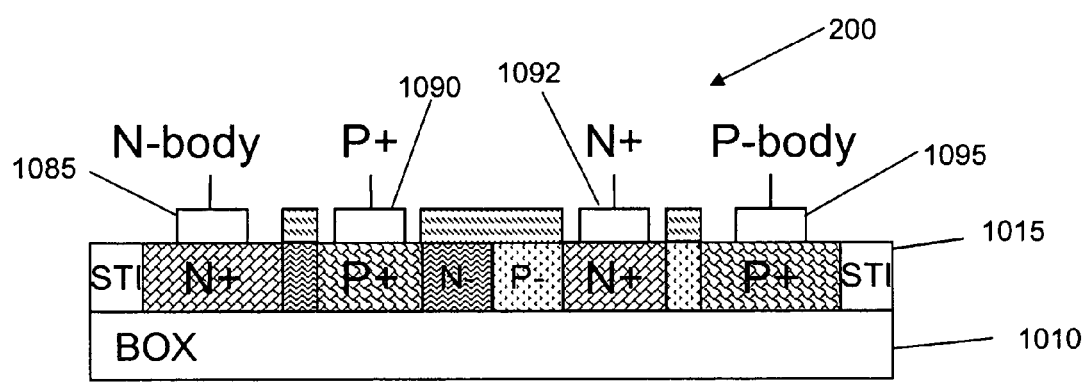

FIG. 18 shows a final SCR structure 200 after further processing steps. As shown in FIG. 18, N-body contact 1085, P-body contact 1095, P+ contact 1090 and N+ contact 1092 have been formed on the device. Moreover, as explained above, the P+ contact 1090 forms the anode of the SCR 200 and the N+ contact 1092 forms the cathode of the SCR 200. The N-body contact 1085 and the P-body contact 1095 are used to trigger the SCR 200. Additionally, as described above, the formation process results in a structure comprising a lateral integrated P+-N body diode and N+-P body diode according to an aspect of the invention. Further, the n-/p-body of the SCR is connected to the n-/p- body of the integrated diode through an under the polysilicon channel.

Design Flow

Figure 19:
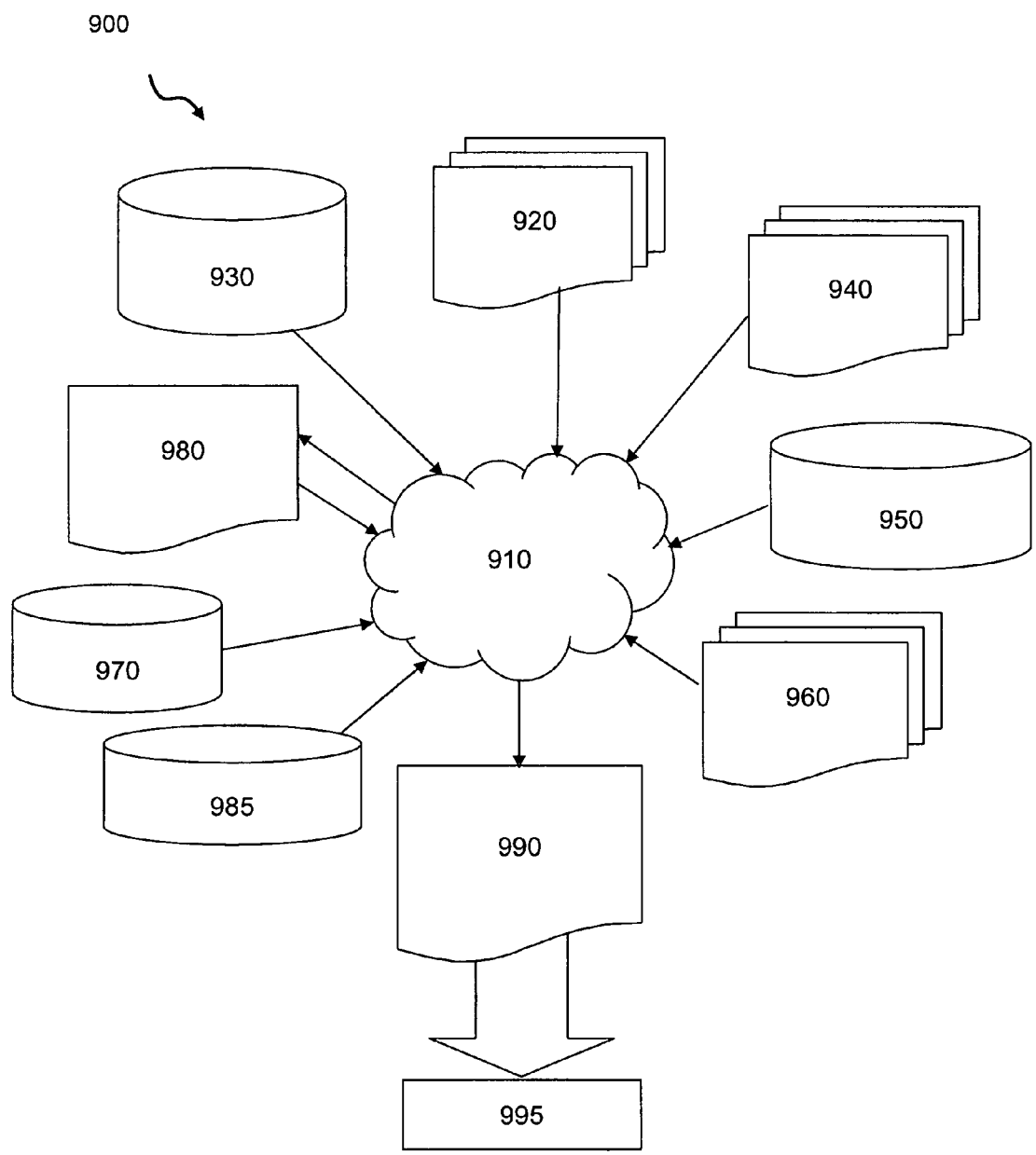
FIG. 19 is a flow diagram of a design process used in semiconductor design, manufacturing, and/or testing.

FIG. 19 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 2A-5 in the form of schematics or HDL, a hardware-description language (e.g., VERILOG®, Very High Speed Integrated Circuit (VHSIC) Hardware Description Language (VHDL), C, etc.). VERILOG is a registered trademark of Cadence Design Systems, Inc. in the United States, other countries, or both. Design structure 920 may be contained on one or more machine readable medium. For example, design structure 920 may be a text file or a graphical representation of an embodiment of the invention as shown in FIGS. 2A-5. Design process 910 preferably synthesizes (or translates) an embodiment of the invention as shown in FIGS. 2A-5 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 2A-5, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 2A-5. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of embodiments, those of skill in the art will recognize that the invention can be practiced with modifications and in the spirit and scope of the appended claims.

What is claimed is:

1. A method comprising:
    forming a P+-N body diode in a lightly doped N-well;
    forming an N+-P body diode in a lightly doped P-well,
    wherein the P+-N body diode and the N+-P body diode are laterally integrated and form a silicon controlled rectifier (SCR);
    forming a plurality of integrated diodes, having integrated diode widths, disposed along a width of the SCR;
    forming an SCR n-/p- body; and
    forming an integrated diode n-/p- body.

2. The method of claim 1, further comprising:
    forming an insulator layer on a substrate;
    forming an active layer on the insulating layer;
    forming the lightly doped P-well and the lightly-doped N-well in the active layer,
    wherein the lightly doped P-well is formed adjacent to the lightly-doped N-well and a PN junction is formed between the lightly doped P-well and the lightly-doped N-well.

3. The method of claim 1, wherein the P+-N body diode and the N+-P body diode are formed coplanar and in contact with an insulating layer.

4. The method of claim 2, wherein the insulating layer is a buried oxide (BOX) layer.

5. The method of claim 1, wherein:
    a P+ region of the P+-N body diode provides an anode of the SCR; and
    an N+ region of the N+-P body diode provides a cathode of the SCR.

6. The method of claim 1, wherein:
    an N+ region of the P+-N body diode provides an N-body contact to trigger the SCR; and
    a P+ region of the N+-P body diode provides a P-body contact to trigger the SCR.

7. The method of claim 1, wherein the SCR n-/p- body and the integrated diode n-/p- body are connected under a polysilicon layer and the integrated diode widths are substantially equal to a width of the SCR.

8. A method comprising:
    forming a P+-N body diode in a lightly doped N-well; and
    forming an N+-P body diode in a lightly doped P-well,
    wherein the P+-N body diode and the N+-P body diode are laterally integrated and form a silicon controlled rectifier (SCR), wherein:
        a P+ region of the P+-N body diode provides an anode of the SCR,
        an N+ region of the N+-P body diode provides a cathode of the SCR, and further comprising forming:
        a plurality of integrated diodes, having integrated diode widths, disposed along a width of the SCR;
        an SCR n-/p- body; and
        an integrated diode n-/p- body,
    wherein the SCR n-/p- body and the integrated diode n-/p- body are connected under a polysilicon layer and the integrated diode widths are substantially equal to a width of the SCR.

9. The method of claim 8, wherein a first conductivity region in an active layer surrounds one of the cathode and the anode of the SCR and provides at least two current paths in the SCR, and
    the at least two current paths include a first current path from the one of the cathode and anode of the SCR to one of the anode and cathode of the SCR, and a second current path from one of the cathode and anode of the SCR to the at least one integrated diode.

* * * * *